United States Patent
Guo et al.

(10) Patent No.: US 10,882,446 B2
(45) Date of Patent: Jan. 5, 2021

(54) GRADED EARLY WARNING SYSTEM FOR ROLLOVER OF HEAVY-DUTY TRUCK BASED ON TIME-VARYING INTERACTIVE KALMAN FILTERING AND EARLY WARNING METHOD THEREOF

(71) Applicant: Henan Polytechnic University, Henan (CN)

(72) Inventors: Jingwei Guo, Henan (CN); Lutian Li, Henan (CN); Jiajun Zhan, Henan (CN); Xin Qin, Henan (CN); Zhongqi Xie, Henan (CN); Haofei Guo, Henan (CN); Fugen Lin, Henan (CN); Chen Wang, Henan (CN); Yi Cai, Henan (CN); Yinan Chen, Henan (CN); Shuang Ma, Henan (CN); Yating Hu, Henan (CN); Yanran Liu, Henan (CN); Yaxing Zhai, Henan (CN); Donghui Xie, Henan (CN)

(73) Assignee: Henan Polytechnic University, Jiaozuo (CN)

( * ) Notice: Subject to any disclaimer, the term of this patent is extended or adjusted under 35 U.S.C. 154(b) by 0 days.

(21) Appl. No.: 16/246,533

(22) Filed: Jan. 13, 2019

(65) Prior Publication Data

US 2019/0225149 A1    Jul. 25, 2019

(30) Foreign Application Priority Data

Jan. 22, 2018  (CN) .......................... 2018 1 0056921
Jan. 22, 2018  (CN) .......................... 2018 1 0056926

(51) Int. Cl.

| | | |
|---|---|---|
| *B60Q 1/00* | (2006.01) | |
| *B60Q 9/00* | (2006.01) | |
| *G01C 9/00* | (2006.01) | |
| *G06F 3/14* | (2006.01) | |
| *G06F 3/147* | (2006.01) | |
| *G06F 30/15* | (2020.01) | |

(52) U.S. Cl.
CPC ................. *B60Q 9/00* (2013.01); *G01C 9/00* (2013.01); *G06F 3/14* (2013.01); *G06F 3/147* (2013.01); *G06F 30/15* (2020.01); *G09G 2358/00* (2013.01); *G09G 2380/10* (2013.01)

(58) Field of Classification Search
CPC .......... B60Q 9/00; G01C 21/165; G01C 9/00; G06F 30/15; G06F 3/14; G06F 3/147; G09G 2358/00; G09G 2380/10
USPC ........................................................ 340/440
See application file for complete search history.

(56) References Cited

U.S. PATENT DOCUMENTS

| | | | | |
|---|---|---|---|---|
| 5,779,596 | A * | 7/1998 | Weber ................... | A61B 5/222 482/4 |
| 6,002,975 | A * | 12/1999 | Schiffmann ......... | B60R 21/0132 180/282 |
| 7,522,982 | B2 * | 4/2009 | Le ....................... | B60R 21/0132 180/271 |
| 2004/0128060 | A1 * | 7/2004 | Park ...................... | B60W 30/04 701/124 |
| 2009/0140887 | A1 * | 6/2009 | Breed ..................... | G01S 17/86 340/990 |
| 2014/0081542 | A1 * | 3/2014 | Yao ...................... | B60W 40/076 701/70 |
| 2015/0224845 | A1 * | 8/2015 | Anderson ............ | B60G 17/052 701/37 |
| 2016/0050356 | A1 * | 2/2016 | Nalepka ............. | G06K 9/00791 348/148 |
| 2017/0272842 | A1 * | 9/2017 | Touma ................... | A63B 43/00 |
| 2017/0350721 | A1 * | 12/2017 | Ren ........................ | G01C 23/00 |
| 2018/0162410 | A1 * | 6/2018 | Skillsater ............. | B60W 50/14 |

* cited by examiner

*Primary Examiner* — Naomi J Small
(74) *Attorney, Agent, or Firm* — Wayne & Ken, LLC; Tony Hom (57) ABSTRACT

Disclosed is a graded early warning system for rollover of heavy-duty truck based on time-varying interactive Kalman filtering and early warning method thereof. The system includes an infrared speed measuring module, a gyroscope, a humidity signal acquisition sensor, a bluetooth data transmission module and a main control chip. The infrared speed measuring module, the gyroscope, the humidity signal acquisition sensor are respectively connected with input ends of the main control chip through control lines. A video output end of the main control chip is connected with a liquid crystal display through video signal line. The main control chip is wirelessly connected with a mobile phone through the bluetooth data transmission module.

7 Claims, 5 Drawing Sheets

FIG. 1

Output Waveforms of the Accelerometer and Gyroscope with External Interference

GRADED EARLY WARNING SYSTEM FOR ROLLOVER OF HEAVY-DUTY TRUCK BASED ON TIME-VARYING INTERACTIVE KALMAN FILTERING AND EARLY WARNING METHOD THEREOF

CROSS-REFERENCE TO RELATED APPLICATIONS

This application claims the benefit of priority from Chinese Patent Application No. CN 201810056921.8, filed on Jan. 22, 2018. The content of the aforementioned application, including any intervening amendments thereto, is incorporated herein by reference in its entirety.

TECHNICAL FIELD

The present invention relates to the technical field of early warning for rollover of heavy-duty truck, and in particular to a graded early warning system for rollover of heavy-duty truck based on time-varying interactive Kalman filtering and early warning method thereof.

BACKGROUND OF THE INVENTION

With the development of expressways, the development of the road transport industry with various heavy vehicles as the carrier is booming. At the same time, when heavy vehicles are driving at high speeds, especially when the load is too heavy, it is easy to cause dangerous conditions such as rollover, and the number of traffic accidents is keep in a high level. Therefore, the stability and safety of heavy vehicles have become a bottleneck which constrains the development of road transport industry.

Rollover is one of the most serious accidents that threaten people's safety while driving. According to the NHTSA study of the US Highway Safety Administration, the damage caused by the vehicle rollover during use is second only to the collision.

Statistics show that there were 5.615 million traffic accidents in the United States in 2014, and vehicle rollover accidents accounted for 2.0%, but the traffic accident casualties caused by vehicle rollover accounted for 20.3%. In China, according to the statistics of the Ministry of Public Security, there were 16 severe traffic accidents in 2015, resulting in 219 casualties, wherein 5 traffic accidents were caused by rollovers, resulting in 77 casualties. Statistics show that the proportion of casualties caused by vehicle rollover is as high as 35%. Therefore, the research on vehicle rollover and anti-rollover control has been gradually paid attention.

Vehicle rollover is a complex process and caused by multiple factors. When a vehicle rollover is happening, the driver often cannot take effective measures, and the damage of the rollover accident is fatal. The driver should be made to sense the risk of potential rollover in advance so that the driver is ensured to have sufficient time to take appropriate measures to avoid traffic accidents. Therefore, the study on graded early warning system for rollover of heavy-duty truck has great theoretical significance and practical value for road traffic safety. According to the distribution of type of fatal truck accidents in 2015, such as: private cars accounted for 20%, rollover accounted for 57%, collision accounted for 12%, and others accounted for 31%.

Research Status at Home and Abroad

Many foreign countries have extensively researched on early warning for rollover. In 2003, Chen first proposed an early warning method for vehicle rollover based on the vehicle rollover model to predict the rollover time TTR. The algorithm strove for the improvement of accuracy, but the running speed of the algorithm limited its practicality. Tarko designed the genetic algorithm to evaluate the ultimate deformation of the tire to judge the offset degree of vehicle and predict the probability of accident. However, due to the defect of the genetic algorithm itself, the prediction has poor real-time defects. Islam calculates the rollover acceleration threshold based on the vehicle's center of mass and uses this as a condition to determine the rollover. However, this method does not consider the disturbance effect of the center of gravity position, so when the vehicle status parameter changes greatly, the early warning threshold will cause large fluctuations.

Domestically, Xia Jingjing et al. proposed a rollover active control method based on model prediction. This method achieves the stiffness adjustment of the air suspension by controlling the inflated and deflated of the air suspension to achieve active control of the vehicle rollover and improve the rolling stability of heavy-duty vehicle; Zhu Tianjun et al. proposed an early warning method for rollover based on improved TTR and Kalman filtering techniques. The test results show that the method can provide real-time early warning; Jin Zhilin et al. used sports cars as research objects and proposed an early warning method for vehicle rollover based on dynamic factors, which shows that the algorithm can accurately judge the condition of the vehicle rollover.

TABLE 1

Features and defects of solutions of prior art

| Prior art | Features | Defects |
| --- | --- | --- |
| Freight train warning system that turns on one's side (CN205177176U) | The output end of pressure sensor is connected with the input end of the single chip microcomputer; the output end of the single chip microcomputer is connected with the control end of the variable information board; the rollover threshold is determined by pressure value. | The pressure source itself is an unstable pressure. The anti-interference ability of the relevant instruments and pressure sensors is not strong, and the vibration of the sensor itself will transmit wrong decisions. |
| Prevent car alarm device that turns on one's side (CN205871872U) | The condition of rollover is determined by depending on a plurality of sensors, connecting with SM Bus controller and using relay controller. | The acquired data is not analyzed, and the discrete data is disturbed by itself, which makes the early warning for rollover |

TABLE 1-continued

Features and defects of solutions of prior art

| Prior art | Features | Defects |
|---|---|---|
| Car is prevented turning on one's side and is detected warning device (CN205871874U) | By adding a sliding base structure that can slide according to the inclination angle to cooperate with supporting connecting rod structure, rollover can be sensed and an early warning will be issued. | extremely unscientific. The sliding structure includes an upper base, a lower base, an elastic component and a plurality of sliding blocks, and the mechanical structure has high requirements on materials, welding and the like, and the early warning accuracy is greatly affected by the sliding structure. |
| Rollover warning method and rollover warning device for heavy vehicle (CN104401323) | The classic Kalman filtering technique is used to construct a simple early warning model for rollover to estimate the motion state of heavy vehicles, and the TTR algorithm is used to predict the risk of rollover. | The rollover threshold selected by the traditional TTR algorithm is difficult to accurately set due to changes in driving conditions, which may cause early or late of the early warning. |

In summary, most algorithms of early warning for rollover at home and abroad do not consider the time-varying of data and interactions between the data. However, existing patents have many defects in physical structure, data analysis and other aspects, so it is difficult to accurately predict the risk of a rollover of the vehicle at a future time.

SUMMARY OF THE INVENTION

In order to overcome defects of the prior art, the present invention has provided a graded early warning system for rollover of heavy-duty truck based on time-varying interactive Kalman filtering and early warning method thereof.

In order to achieve the above object, the present invention adopts the following technical solutions:

A graded early warning system for rollover of heavy-duty truck based on time-varying interactive Kalman filtering are used for detecting and monitoring vehicle conditions, including: an infrared speed measuring module, a gyroscope, a humidity signal acquisition sensor, a bluetooth data transmission module and a main control chip. The infrared speed measuring module 1, the gyroscope 2, the humidity signal acquisition sensor 3 are respectively connected with input ends of the main control chip 4 through control lines. A video output end of the main control chip 4 is connected with a liquid crystal display 6 through video signal line. The main control chip 4 is wirelessly connected with a mobile phone 7 through the bluetooth data transmission module.

The graded early warning system for rollover of heavy-duty truck based on time-varying interactive Kalman filtering, wherein the gyroscope 2 is a physical parameter instrument for collecting acceleration for serial data.

The graded early warning system for rollover of heavy-duty truck based on time-varying interactive Kalman filtering, wherein the humidity signal acquisition sensor is a climate parameter instrument for collecting temperature and humidity.

The graded early warning system for rollover of heavy-duty truck based on time-varying interactive Kalman filtering, wherein the bluetooth data transmission module is configured for realizing wireless information transmission between the main control chip and the mobile phone.

The graded early warning system for rollover of heavy-duty truck based on time-varying interactive Kalman filtering, wherein the main control chip is a chip with functions of completing system programming and algorithm design, and the model number is STC89c52RC.

A graded early warning method for rollover of heavy-duty truck based on time-varying interactive Kalman filtering includes: using a rigid body model of an automobile as physical model for analyzing the rollover threshold of truck under real-time condition, collecting index data of vehicle acceleration, degree offset, road humidity through the infrared speed measuring module, the gyroscope and the humidity signal acquisition sensor, concentrating the collected data on the main control chip and completing date processing by using time-varying interactive Kalman filtering and integration of data mining technology of quaternion algorithm, carrying out mechanical analysis of the rigid body model to obtain condition equation of rollover, namely, conditions for determining a rollover of the truck, and achieving information transmission between the main control chip and a mobile APP by means of a bluetooth data transmission module, and further realizing graded early warning management of the driving condition of the truck.

Further, graded early warning process for rollover of heavy-duty truck based on time-varying interactive Kalman filtering includes: coding by a monitoring and management platform in a control center by NJS, packaging and releasing the code as an application installation package in HBUILDER; connecting the running program with the main control chip by calling a bluetooth data transmission module, receiving the hexadecimal date output by the sensors by applying HTML5 streaming across mobile phone platform and displaying the current driving status of the truck by combining the geographic information of BAIDU api, constructing a graded time-varying interactive Kalman filtering model by the attitude angle measurement system of the infrared speed measuring module and the gyroscope, fusing signal of the infrared speed measuring module and the gyroscope, effectively compensating the effects of sensor drift and measurement noise on the infrared speed measuring module and the gyroscope by the model on the basis of the dynamic data acquisition test, thus reducing the attitude angle measurement error, and avoiding the defects of fast parameter change and being difficult to eliminate the deviation value; the specific implementation steps are as follows:

(1) construction of a time-varying interactive Kalman filtering model constructing a time-varying interactive Kalman filtering model based on the acquired data belonging to time-varying data and interacting between data, and outputting a waveform curve;

(2) attitude algorithm of data $A_x, A_y, A_z$)

$O_x, O_y, O_z$)

RollL(RollH),PitchL(PitchH),YawL(YawH)

calculating the time-varying data by designing a quaternion method to obtain the calculated data; obtaining an initial attitude (QUOTE$A_x, A_y, A_z$)$A_x, A_y, A_z$) under static conditions by using a three-axis accelerometer and a three-axis magnetometer; processing the initial data by the quaternion in the process of converting the initial data into the measured data; wherein QUOTE$A_xL(A_xH), A_yL(A_yH), A_zL(A_zH)A_xL(A_xH), A_yL(A_yH), A_zL(A_zH)$ are high byte and low byte of acceleration in the X-axis, Y-axis and Z-axis, respectively; and an attitude of (QUOTE$O_x, O_y, O_z$)$O_x, O_y, O_z$) is obtained under the motion condition; wherein QUOTE$O_xL(O_xH), O_yL(O_yH), O_zL(O_zH)O_xL(O_xH), O_yL(O_yH), O_zL(O_zH)$ are high byte and low byte of acceleration on X-axis, Y-axis and Z-axis, respectively; wherein QUOTERollL(RollH),PitchL(PitchH),YawL(YawH)RollL(RollH),PitchL(PitchH),YawL(YawH) are high byte and low byte of angle on the X-axis, Y-axis and Z-axis, respectively;

(3) graded early warning management system to reflect graded early warning management, dividing a prompt into five grades according to a driving condition: no warning, first to third level warning and fourth level warning; truck drivers are given safe driving, be careful, dangerous or extremely dangerous prompts correspondingly and a distress signal is automatically issued when necessary.

The present invention has the following advantages due to the technical solution as described above:

The graded early warning method for rollover of heavy-duty truck based on time-varying interactive Kalman filtering realizes the close combination between the single chip microcomputer and the mobile APP by means of the combination of software and hardware and makes design of this system become a fully functional prediction system by the application of visualization platform to guarantee the safety of the driver. The creative point of this system mainly reflects in the following aspects:

(1) graded early warning: graded early warning prompts for rollover are given according to driving status of different safety grades of the vehicle, and a distress signal is automatically issued when necessary.

(2) real-time monitoring: the speed and the external environment of the vehicle is changing at any time during the process of driving; the predicted value for rollover of the vehicle can be processed and obtained by collecting external data by the sensor to guarantee safety of the driver.

(3) comprehensive data: index, such as driving acceleration, angle offset, road humidity, temperature, steering wheel offset, and time-varying speed are proposed to achieve zero error, and it can be processed in different environments, such as rain, snow, fog and haze.

(4) economical and practical: it maximums the consideration for public standard and avoids high cost; part of the software is developed with standard of market product, and it has good portability and practicability.

(5) creative technology: the present system considers that the acquired data belongs to time-varying data and there is interaction among data. It can accurately output the current attitude of module under dynamic environment, reduce the measurement noise and improve the measurement accuracy by combining the attitude algorithm device and the time-varying interactive Kalman filtering algorithm. The gravity field is used for filtering modification, which avoids the drift in angle measurement. The measurement data is accurate to 0.01 degrees, therefore, the stability is extremely high.

The present invention predicts the rollover of vehicles by the combination of hardware and software to guarantee safe driving of vehicles and create harmonious traffic environment. Advantages of this system are: (1) specialized service and low cost; (2) suitable for the public and high practicality; (3) high integration and easy to control and dismantle; (4) multi-factor controlled and high accuracy; (5) stable system and adaptable to harsh environment.

The present invention studies the graded early warning for rollover of heavy-duty trucks. Some beneficial results were obtained by studying. Value of the product can be divided into three categories:

(1) social significance: the present invention has deep studied on the problem of the rollover of vehicles. Currently, the rollover accidents of truck is frequently happened and the unsafe factors of traffic have caused great impact on transportation. Therefore, we have to change in this aspect, and the product should be popularized as soon as possible for the consideration of the safety of drivers and pedestrian.

(2) practical value: it adopts multiple data processing and improved algorithms and uses multifunctional sensors composed of cheap hardware, which is different from the high end of other products. It can guarantee the control accuracy of the system in the case of external interference and improve the reliability and and anti-interference ability of the control system.

(3) economical benefits: the design object of the product is to be manufactured and used in the truck. It can remind drivers in time when something dangerous happens to avoid the damage of both people and vehicles and minimize the problem of road congestion. Even if something dangerous happens, it can automatically call for help, therefore, the relevant personnel can arrive in time, which plays a good preventive effect on further damage of property.

The present invention has the following advantages due to the technical solution as described above:

A graded early warning system for rollover of heavy-duty truck based on time-varying interactive Kalman filtering and early warning method thereof realizes the close combination between the single chip microcomputer and the mobile APP by means of the combination of software and hardware and makes design of this system become a fully functional prediction system by the application of visualization platform to guarantee the safety of the driver. The creative point of this system mainly reflects in the following aspects:

(1) graded early warning: graded early warning prompts for rollover are given according to driving status of different safety grades of the vehicle, and a distress signal is automatically issued when necessary.

(2) real-time monitoring: the speed and the external environment of the vehicle is changing at any time during the process of driving; the predicted value for rollover of the vehicle can be processed and obtained by collecting external data by the sensor to guarantee safety of the driver.

(3) comprehensive data: index, such as driving acceleration, angle offset, road humidity, temperature, steering wheel offset, and time-varying speed are proposed to achieve zero error, and it can be processed in different environments, such as rain, snow, fog and haze.

(4) economical and practical: it maximums the consideration for public standard and avoids high cost. Part of the software is developed with standard of market product, and it has good portability and practicability.

(5) creative technology: the present system considers that the acquired data belongs to time-varying data and there is interaction among data. It can accurately output the current attitude of module under dynamic environment, reduce the measurement noise and improve the measurement accuracy by combining the attitude algorithm device and the time-varying interactive Kalman filtering algorithm. The gravity field is used for filtering modification, which avoids the drift in angle measurement. The measurement data is accurate to 0.01 degrees, therefore, the stability is extremely high.

The present invention predicts the rollover of vehicles by the combination of hardware and software to guarantee safe driving of vehicles and create harmonious traffic environment. Advantages of this system are: (1) specialized service and low cost; (2) suitable for the public and high practicality; (3) high integration and easy to control and dismantle; (4) multi-factor controlled and high accuracy; (5) stable system and adaptable to harsh environment.

The present invention studies the graded early warning for rollover of heavy-duty trucks. Some beneficial results were obtained by studying. Value of the product can be divided into three categories:

(1) social significance: the present invention has deep studied on the problem of the rollover of vehicles. Currently, the rollover accidents of truck is frequently happened and the unsafe factors of traffic have caused great impact on transportation. Therefore, we have to change in this aspect, and the product should be popularized as soon as possible for the consideration of the safety of drivers and pedestrian.

(2) practical value: it adopts multiple data processing and improved algorithms and uses multifunctional sensors composed of cheap hardware, which is different from the high end of other products. It can guarantee the control accuracy of the system in the case of external interference and improve the reliability and and anti-interference ability of the control system.

(3) economical benefits: the design object of the product is to be manufactured and used in the truck. It can remind drivers in time when something dangerous happens to avoid the damage of both people and vehicles and minimize the problem of road congestion. Even if something dangerous happens, it can automatically call for help, therefore, the relevant personnel will can arrive in time, which plays a good preventive effect on further damage of property.

In the drawings: 1. infrared speed measuring module; 2. gyroscope; 3. humidity signal acquisition sensor; 4. main control chip; 5. bluetooth data transmission module; 6. liquid crystal display; 7. mobile phone; 8. weather and altitude; 9. real-time vehicle status; 10. positioning and navigation; 11. early warning response.

DETAILED DESCRIPTION OF EMBODIMENTS

As shown in FIGS. 1-5, a graded early warning system for rollover of heavy-duty truck based on time-varying interactive Kalman filtering can be used for detecting and monitoring vehicle conditions, including: an infrared speed measuring module 1, a gyroscope 2, a humidity signal acquisition sensor 3, a bluetooth data transmission module 5 and a main control chip 4. The infrared speed measuring module 1, the gyroscope 2, the humidity signal acquisition sensor 3 are respectively connected with input ends of the main control chip 4 through control lines. A video output end of the main control chip 4 is connected with a liquid crystal display 6 through video signal line. The main control chip 4 is wirelessly connected with a mobile phone 7 through the bluetooth data transmission module 5.

Figure 1:
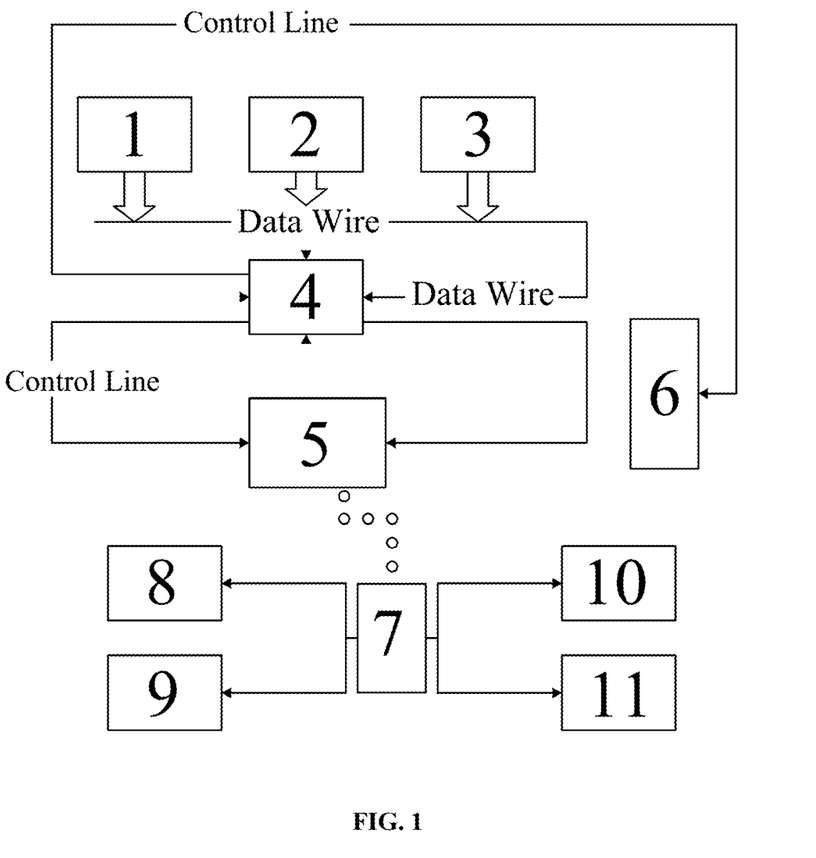
FIG. 1 is a structural diagram of graded early warning system for rollover of heavy-duty truck based on time-varying interactive Kalman filtering.

The gyroscope 2 is a physical parameter instrument for collecting acceleration for serial data. The humidity signal acquisition sensor is a climate parameter instrument for collecting temperature and humidity. The bluetooth data transmission module 5 is configured for realizing wireless information transmission between the main control chip and the mobile phone. The main control chip is a chip with functions of completing system programming and algorithm design, and the model number is STC89c52RC.

The present device uses the multi-disciplinary knowledge system to construct the basic theoretical model, and verifies the feasibility of the system by means of experimental data, and perfects the system through repeated practical operation data. The interface of APP of the mobile phone 7 of the system includes weather and altitude 8, real-time vehicle status 9, positioning and navigation 10, early warning response 11.

Figure 5:
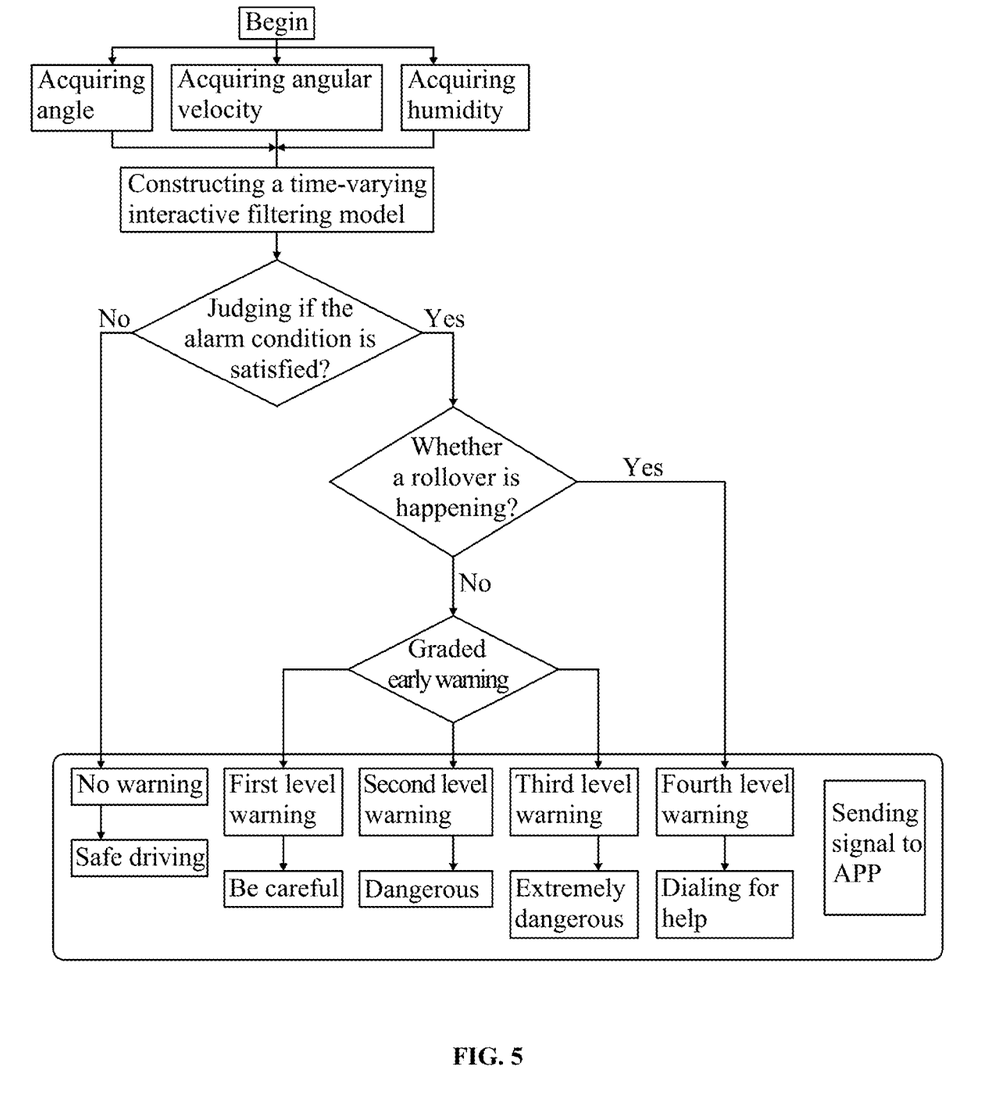
FIG. 5 is a flow diagram of graded early warning for rollover of heavy-duty truck based on time-varying interactive Kalman filtering.

A graded early warning method for rollover of heavy-duty truck based on time-varying interactive Kalman filtering includes: using a rigid body model of an automobile as physical model for analyzing the rollover threshold of truck under real-time condition; collecting index data of vehicle acceleration, degree offset, road humidity through several kinds of sensors; concentrating the collected data on the main control chip, and completing date processing by using time-varying interactive Kalman filtering and integration of data mining technology of quaternion algorithm; carrying out mechanical analysis of the rigid body model to obtain condition equation of rollover, namely, conditions for determining a rollover of the truck; and achieving information transmission between the main control chip and an APP of the mobile phone 7 by means of a bluetooth data transmission module, and further realizing graded early warning management of the driving condition of the truck.

Figure 2:
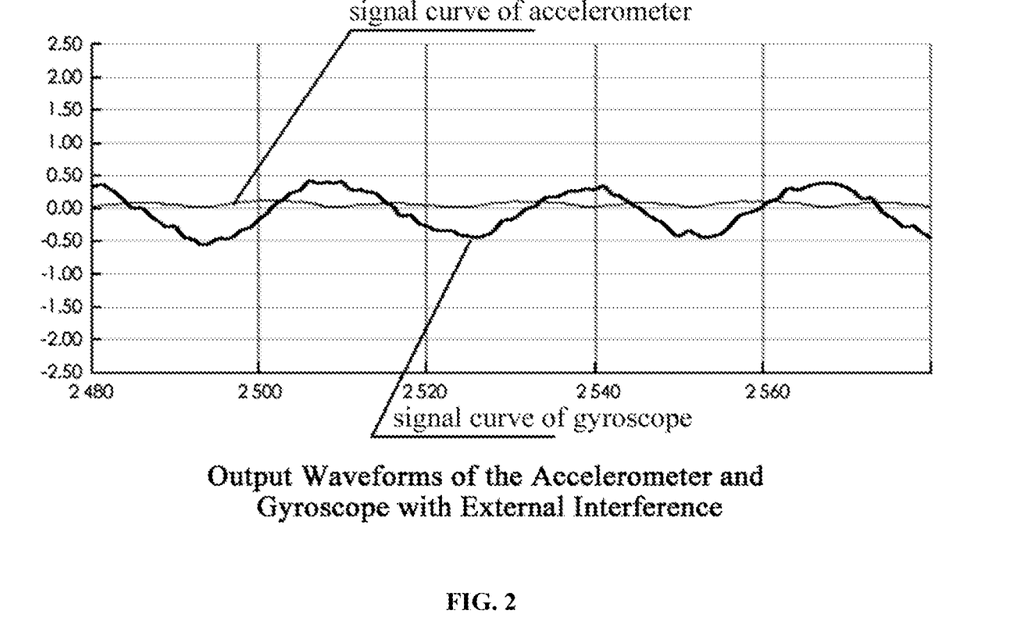
FIG. 2 is an output waveform diagram of an infrared speed measuring module and the gyroscope when adding an external interference.
Figure 3:
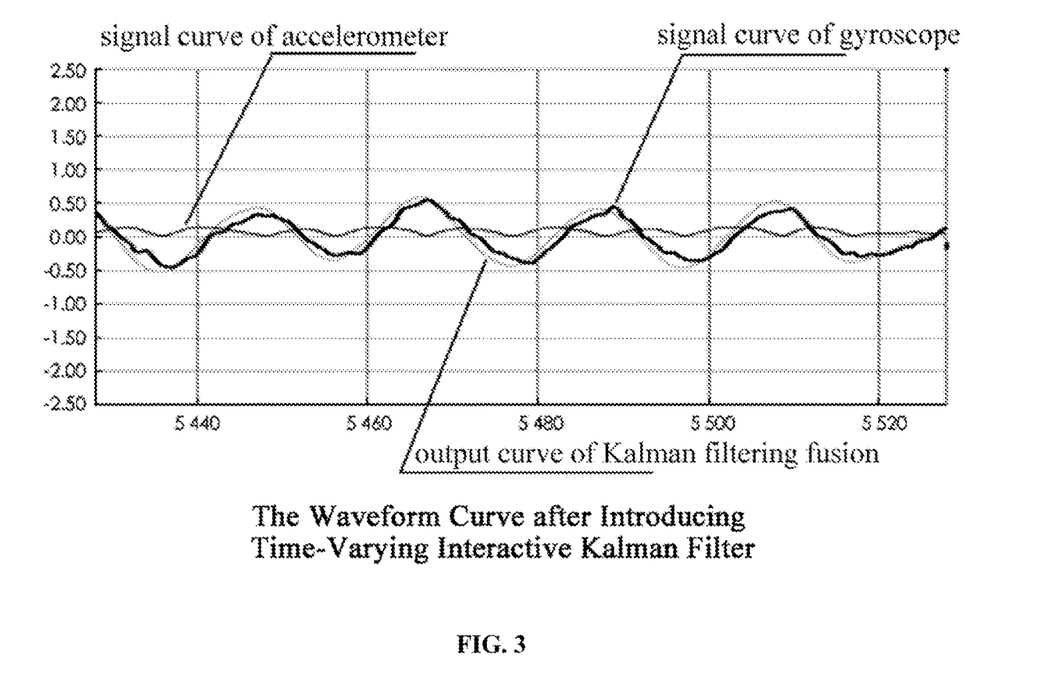
FIG. 3 is a waveform graph after introducing time-varying interactive Kalman filtering.
Figure 4:
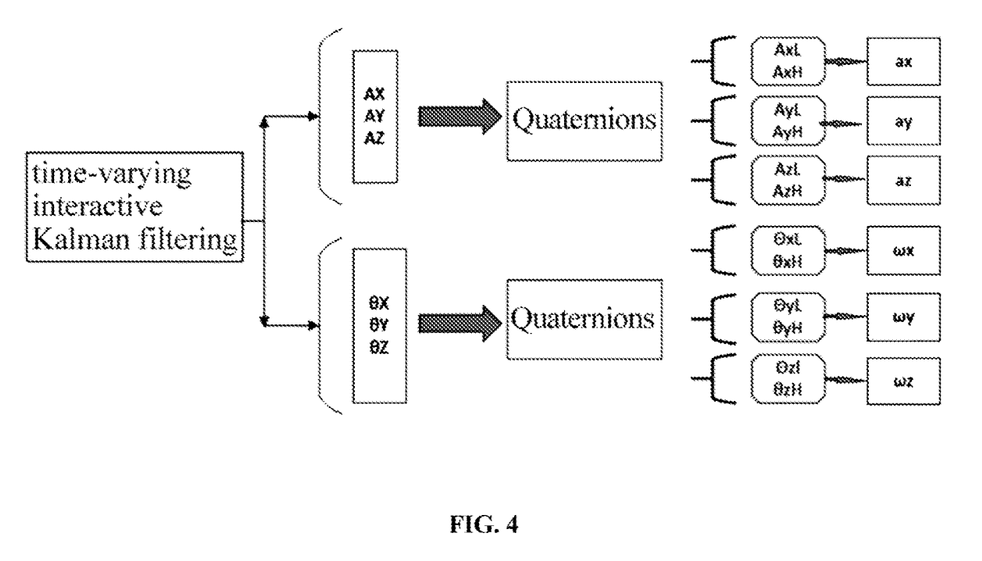
FIG. 4 is a calculating diagram of time-varying interactive Kalman filtering data.

The graded early warning process for rollover of heavy-duty truck based on time-varying interactive Kalman filtering includes: coding by a monitoring and management platform in a control center by NJS; packaging and releasing the code as an application installation package in HBUILDER; connecting the running program with the main control chip by calling a bluetooth data transmission module, receiving the hexadecimal date output by the sensors by applying HTML5 streaming across mobile phone platform and displaying the current driving status of the truck by combining the geographic information of BAIDU api, constructing a graded time-varying interactive Kalman filtering model by the attitude angle measurement system of the infrared speed measuring module and the gyroscope, fusing signal of the accelerometer and the gyroscope, effectively compensating the effects of sensor drift and measurement noise on the infrared speed measuring module and the gyroscope on the basis of the dynamic data acquisition test; thus reducing the attitude angle measurement error, and avoiding the defects of fast parameter change and being difficult to eliminate the deviation value; the specific implementation steps are as follows:

(1) construction of a time-varying interactive Kalman filtering model constructing a time-varying interactive Kalman filtering model based on the acquired data belonging to time-varying data and interacting between data, and outputting a waveform curve;

(2) attitude algorithm of data $A_x, A_y, A_z$)

$A_xL(A_xH), A_yL(A_yH), A_zL(A_zH)$ $O_x, O_y, O_z$)

$O_xL(O_xH), O_yL(O_yH), O_zL(O_zH)$

RollL(RollH),PitchL(PitchH),YawL(YawH)

calculating the time-varying data by designing a quaternion method to obtain the calculated data; obtaining an initial attitude (QUOTE$A_x, A_y, A_z$)$A_x, A_y, A_z$) under static conditions by using a three-axis accelerometer and a three-axis magnetometer; processing the initial data by the quaternion in the process of converting the initial data into the measured data; wherein QUOTE$A_xL(A_xH), A_yL(A_yH), A_zL(A_zH)A_xL(A_xH), A_yL(A_yH), A_zL(A_zH)$ are high byte and low byte of acceleration in the X-axis, Y-axis, and Z-axis, respectively; and an attitude of (QUOTE$O_x, O_y, O_z)O_x, O_y, O_z$) is obtained under the motion condition; wherein QUOTE$O_xL(O_xH)$, $O_yL(O_yH), O_zL(O_zH)O_zL(O_xH), O_yL(O_yH)$, $O_zL(O_zH)$ are high byte and low byte of acceleration on X-axis, Y-axis, and Z-axis, respectively; wherein QUOTERollL(RollH),PitchL(PitchH),YawL(YawH)RollL (RollH),PitchL(PitchH),YawL(YawH) are high byte and low byte of angle on the X-axis, Y-axis, and Z-axis, respectively;

(3) graded early warning management system to reflect graded early warning management, dividing a prompt into five grades according to a driving condition: no warning, first to third level warning and fourth level warning; truck drivers are given safe driving, be careful, dangerous or extremely dangerous prompts correspondingly, and a distress signal is automatically issued when necessary.

The present invention realizes the close combination between the single chip microcomputer and the mobile APP by means of the combination of software and hardware and makes design of this system become a fully functional prediction system by the application of visualization platform to guarantee the safety of the driver. The creative point of this system mainly reflects in the following aspects:

(1) graded early warning: graded early warning prompts for rollover are given according to driving status of different safety grades of the vehicle, and a distress signal is automatically issued when necessary.

(2) real-time monitoring: the speed and the external environment of the vehicle is changing at any time during the process of driving. The predicted value for rollover of the vehicle can be processed and obtained by collecting external data by the sensor to guarantee safety of the driver.

(3) comprehensive data: index, such as driving acceleration, angle offset, road humidity, temperature, steering wheel offset, and time-varying speed are proposed to achieve zero error, and it can be processed in different environments, such as rain, snow, fog and haze.

(4) economical and practical: it maximums the consideration for public standard and avoids high cost; part of the software is developed with standard of market product, and it has good portability and practicability.

(5) creative technology: the present system considers that the acquired data belongs to time-varying data and there is interaction among data. It can accurately output the current attitude of module under dynamic environment, reduce the measurement noise and improve the measurement accuracy by combining the attitude algorithm device and the time-varying interactive Kalman filtering algorithm. The gravity field is used for filtering modification, which avoids the drift in angle measurement. The measurement data is accurate to 0.01 degrees, therefore, the stability is extremely high.

What is claimed is:

1. A graded early warning system for rollover of heavy-duty truck based on time-varying interactive Kalman filtering, comprising:
   an infrared speed measuring module;
   a gyroscope;
   a humidity signal acquisition sensor;
   a bluetooth data transmission module; and
   a main control chip;
   wherein the infrared speed measuring module, the gyroscope, the humidity signal acquisition sensor are respectively connected with input ends of the main control chip through control lines; a video output end of the main control chip is connected with a liquid crystal display through video signal line; the main control chip is wirelessly connected with a mobile phone through the bluetooth data transmission module,
   wherein the infrared speed measuring module, the gyroscope and the humidity signal acquisition sensor are configured for collecting index data of vehicle acceleration, degree offset, road humidity respectively,
   wherein the main control chip is configured for:
      using a rigid body model of an automobile as physical model for analyzing the rollover threshold of truck under real-time road condition;
      obtaining the index data of vehicle acceleration, degree offset, road humidity;
      constructing a graded time-varying interactive Kalman filtering model;
      completing date processing by using the time-varying interactive Kalman filtering and integration of data mining technology of quaternion algorithm by: processing the index data of vehicle acceleration, degree offset, road humidity according to the Kalman filtering model for compensating sensor drift and measurement noise, obtaining an initial attitude under static conditions by using a three-axis accelerometer and a three-axis magnetometer, processing the initial attitude by the quaternion algorithm, and obtaining a current attitude of the truck based on the processed index data of vehicle acceleration, degree offset, road humidity, together with the processed initial attitude;
      carrying out mechanical analysis of the rigid body model to obtain condition equation of rollover; and
      predicting a rollover of the truck based on the current attitude of the truck and the condition equation of rollover.

2. The early warning system of claim 1, wherein the gyroscope is a physical parameter instrument for collecting acceleration for serial data.

3. The early warning system of claim 1, wherein the humidity signal acquisition sensor is a climate parameter instrument for collecting temperature and humidity.

4. The early warning system of claim 1, wherein the bluetooth data transmission module is configured for realizing wireless information transmission between the main control chip and the mobile phone.

5. The early warning system of claim 1, wherein the main control chip is a chip with functions of completing system programming and algorithm design, and the model number is STC89c52RC.

6. A method for predicting rollover of heavy-duty truck based on time-varying interactive Kalman filtering, the method comprising:
- using a rigid body model of an automobile as physical model for analyzing a rollover threshold of truck under real-time road condition;
- collecting index data of vehicle acceleration, degree offset, road humidity through an infrared speed measuring module, a gyroscope and a humidity signal acquisition sensor;
- constructing a graded time-varying interactive Kalman filtering model;
- concentrating the collected index data on a main control chip and completing date processing by using time-varying interactive Kalman filtering and integration of data mining technology of quaternion algorithm, comprising:
  - processing the index data of vehicle acceleration, degree offset, road humidity according to the Kalman filtering model for compensating sensor drift and measurement noise,
  - obtaining an initial attitude under static conditions by using a three-axis accelerometer and a three-axis magnetometer;
  - processing the initial attitude by the quaternion algorithm;
  - obtaining a current attitude of the truck based on the processed index data of vehicle acceleration, degree offset, road humidity, together with the processed initial attitude;
- carrying out mechanical analysis of the rigid body model to obtain condition equation of rollover;
- predicting a rollover of the truck based on the current attitude of the truck and the condition equation of rollover; and
- achieving information transmission between the main control chip and a mobile APP by means of a bluetooth interface, and further realizing graded early warning management of the driving condition of the truck.

7. The graded warning method of claim 6, wherein the method further comprises:
- coding by a monitoring and management platform in a control center, and packaging and releasing the code as an application installation package;
- connecting the running program with the main control chip by calling the a bluetooth port;
- receiving the hexadecimal date output by the sensors across mobile phone platform and displaying the current driving status of the truck by combining geographic information;

(1) construction of a time-varying interactive Kalman filtering model
constructing a time-varying interactive Kalman filtering model based on the acquired data belonging to time-varying data and interacting between data and outputting a waveform curve;

(2) attitude algorithm of data
$A_x, A_y, A_z$)
$A_xL(A_xH), A_yL(A_yH), A_zL(A_zH)$
$O_x, O_y, O_z$)
$O_xL(O_xH), O_yL(O_yH), O_zL(O_zH)$
RollL(RollH), PitchL(PitchH), YawL(YawH)
calculating the time-varying data by designing a quaternion method to obtain the calculated data;
obtaining an initial attitude (QUOTE$A_x, A_y, A_z$)$A_x, A_y, A_z$) under static conditions by using a three-axis accelerometer and a three-axis magnetometer;
processing the initial data by the quaternion in the process of converting the initial data into the measured data;
wherein QUOTE$A_xL(A_xH), A_yL(A_yH), A_zL(A_zH)A_xL(A_xH), A_yL(A_yH), A_zL(A_zH)$ are high byte and low byte of acceleration in the X-axis, Y-axis, and Z-axis, respectively; and an attitude of(QUOTE$O_x, O_y, O_z$)$O_x, O_y, O_z$) is obtained under the motion condition; wherein QUOTE$O_xL(O_xH), O_yL(O_yH), O_zL(O_zH)O_xL(O_xH), O_yL(O_yH), O_zL(O_zH)$ are high byte and low byte of acceleration on X-axis, Y-axis, and Z-axis, respectively; wherein QUOTERollL(RollH), PitchL(PitchH), YawL(YawH)RollL(RollH), PitchL(PitchH), YawL(YawH) are high byte and low byte of angle on the X-axis, Y-axis, and Z-axis, respectively;

(3) graded early warning management system
to reflect graded warning management, dividing a prompt into five grades according to a driving condition: no warning, first to third level warning and fourth level warning; truck drivers are given safe driving, be careful, dangerous or extremely dangerous prompts correspondingly, and a distress signal is automatically issued when necessary.

* * * * *